US 006556455B2

(12) United States Patent
Dibene, II et al.

(10) Patent No.: US 6,556,455 B2
(45) Date of Patent: Apr. 29, 2003

(54) ULTRA-LOW IMPEDANCE POWER INTERCONNECTION SYSTEM FOR ELECTRONIC PACKAGES

(75) Inventors: Joseph T. Dibene, II, Oceanside, CA (US); David H. Hartke, Durango, CO (US); Carl E. Hoge, San Diego, CA (US); Edward J. Derian, San Diego, CA (US)

(73) Assignee: Incep Technologies, Inc., San Diego, CA (US)

( * ) Notice: Subject to any disclaimer, the term of this patent is extended or adjusted under 35 U.S.C. 154(b) by 0 days.

(21) Appl. No.: 10/022,454

(22) Filed: Oct. 30, 2001

(65) Prior Publication Data

US 2002/0114129 A1 Aug. 22, 2002

Related U.S. Application Data

(63) Continuation of application No. 09/921,152, filed on Aug. 2, 2001, and a continuation of application No. 09/921,153, filed on Aug. 2, 2001, and a continuation of application No. 09/910,524, filed on Jul. 20, 2001, and a continuation-in-part of application No. 09/885,780, filed on Jun. 19, 2001, and a continuation of application No. 09/818,173, filed on Mar. 26, 2001, and a continuation of application No. 09/801,437, filed on Mar. 8, 2001, and a continuation of application No. 09/802,329, filed on Mar. 8, 2001, now Pat. No. 6,452,804, and a continuation of application No. 09/798,541, filed on Mar. 2, 2001, and a continuation of application No. 09/785,892, filed on Feb. 16, 2001, now Pat. No. 6,452,113, and a continuation of application No. 09/727,016, filed on Nov. 28, 2000, and a continuation of application No. 09/432,878, filed on Nov. 2, 1999, now Pat. No. 6,356,448, said application No. 10/022,454, is a continuation of application No. 09/353,428, filed on Jul. 15, 1999, now Pat. No. 6,304,450.

(60) Provisional application No. 60/251,222, filed on Dec. 4, 2000, provisional application No. 60/251,223, filed on Dec. 4, 2000, provisional application No. 60/251,184, filed on Dec. 4, 2000, provisional application No. 60/266,941, filed on Feb. 6, 2001, provisional application No. 60/277,369, filed on Mar. 19, 2001, provisional application No. 60/287,860, filed on May 1, 2001, provisional application No. 60/291,749, filed on May 16, 2001, provisional application No. 60/291,772, filed on May 16, 2001, provisional application No. 60/292,125, filed on May 18, 2001, provisional application No. 60/299,573, filed on Jun. 19, 2001, provisional application No. 60/301,753, filed on Jun. 27, 2001, provisional application No. 60/304,929, filed on Jul. 11, 2001, provisional application No. 60/304,930, filed on Jul. 11, 2001, provisional application No. 60/310,038, filed on Aug. 3, 2001, and provisional application No. 60/313,338, filed on Aug. 17, 2001.

(51) Int. Cl.[7] ............................................. H01R 12/16
(52) U.S. Cl. ..................... 361/785; 361/761; 361/772; 361/787; 257/696
(58) Field of Search ........................ 361/761, 772–774, 361/785, 787; 257/690–697, 735, 737

(56) References Cited

U.S. PATENT DOCUMENTS

| 4,498,530 A | 2/1985 | Lipschutz |
| 4,742,385 A | 5/1988 | Kohmoto |

(List continued on next page.)

FOREIGN PATENT DOCUMENTS

| EP | 0 717 443 A1 | 7/1995 |
| FR | 2 722 334 A1 | 7/1994 |

OTHER PUBLICATIONS

Samtec, "Board Interface Guide," Full Line Catalog F–202, Apr. 2002, 2pp.

Primary Examiner—Albert W. Paladini
Assistant Examiner—Tuan Dinh
(74) Attorney, Agent, or Firm—Knobbe Martens Olson & Bear LLP

(57) ABSTRACT

A power interconnection system comprising a plurality of z-axis compliant connectors passing power and ground signals between a first circuit board to a second circuit board is disclosed. The interconnection system provides for an extremely low impedance through a broad range of frequencies and allows for large amounts of current to pass from one substrate to the next either statically or dynamically. The interconnection system may be located close to the die or may be further away depending upon the system requirements. The interconnection may also be used to take up mechanical tolerances between the two substrates while providing a low impedance interconnect.

27 Claims, 11 Drawing Sheets

U.S. PATENT DOCUMENTS

| | | |
|---|---|---|
| 5,052,481 A | 10/1991 | Horvath et al. |
| 5,092,783 A | 3/1992 | Suarez et al. |
| 5,473,510 A | 12/1995 | Dozier, II |
| 5,515,241 A * | 5/1996 | Werther ............... 361/784 |
| 5,619,399 A | 4/1997 | Mok |
| 5,621,615 A | 4/1997 | Dawson et al. |
| 5,694,297 A * | 12/1997 | Smith et al. ............ 361/785 |
| 5,708,566 A | 1/1998 | Hunninghaus et al. |
| 5,721,454 A | 2/1998 | Palmer |
| 5,729,433 A | 3/1998 | Mok |
| 5,734,555 A | 3/1998 | McMahon |
| 5,761,043 A | 6/1998 | Salmonson |
| 5,864,478 A | 1/1999 | McCutchan et al. |
| 5,930,115 A | 7/1999 | Tracy et al. |
| 5,974,662 A * | 11/1999 | Eldridge et al. ............ 29/842 |
| 5,982,635 A * | 11/1999 | Menzies et al. ............ 361/790 |
| 6,018,465 A | 1/2000 | Borkar et al. |
| 6,351,392 B1 * | 2/2002 | Palaniappa ............... 361/785 |
| 6,359,783 B1 * | 3/2002 | Noble ............... 361/704 |

* cited by examiner

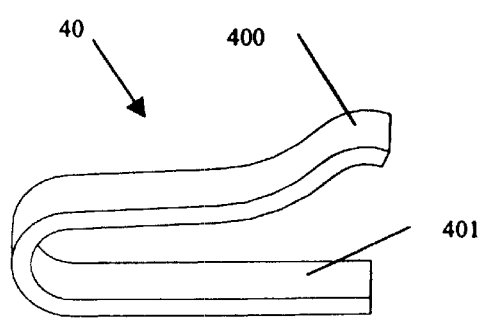
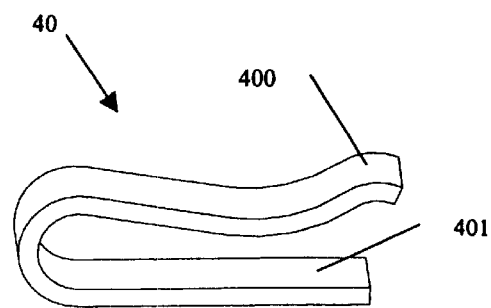
*FIG. 4A*  *FIG. 4B*

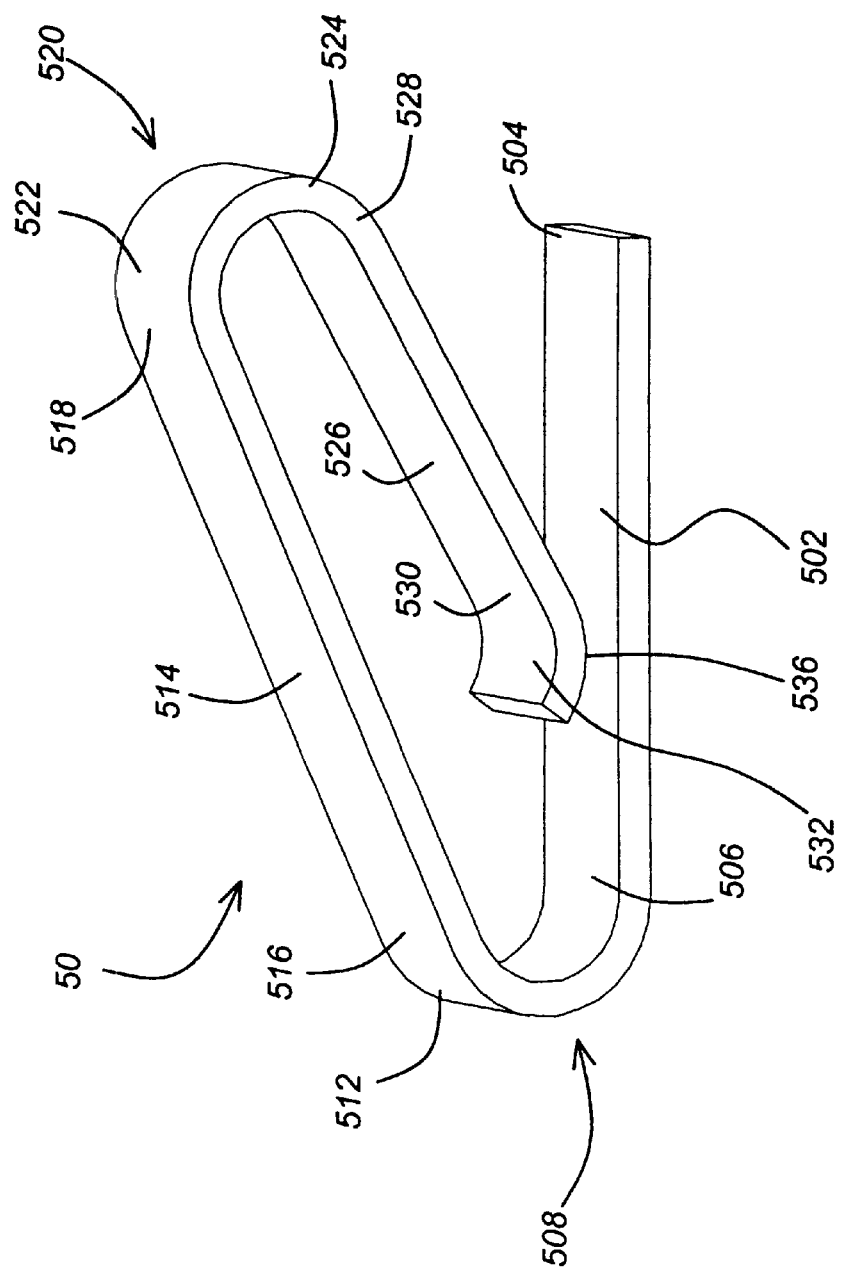

ULTRA-LOW IMPEDANCE POWER INTERCONNECTION SYSTEM FOR ELECTRONIC PACKAGES

CROSS-REFERENCE TO RELATED APPLICATIONS

This application claims benefit of the following provisional patent applications, which are hereby incorporated by reference herein.

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000;

application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

application Ser. No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, Farhad Raiszadeh, filed May 18, 2001;

application Ser. No. 60/299,573, entitled "IMPROVED MICRO-I-PAK STACK-UP ARCHITECTURE," by Joseph T. DiBene, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001;

application Ser. No. 60/304,930, entitled "MICRO-I-PAK," by Joseph T. DiBene II, Carl E. Hoge, David H. Hartke, and Edward J. Derian, filed Jul. 11, 2001;

application Ser. No. 60/310,038, entitled "TOOL-LESS CONCEPTS FOR BORREGO," by Edward J. Derian and Joseph T. DiBene II, filed Aug. 3, 2001; and application Ser. No. 60/313,338, entitled "TOOL-LESS PRISM IPA ASSEMBLY TO SUPPORT IA64 MCKINLEY MICROPROCESSOR," by David H. Hartke and Edward J. Derian, filed Aug. 17, 2001.

This patent application is also continuation-in-part of the following co-pending and commonly assigned patent applications, each of which applications are hereby incorporated by reference herein:

application Ser. No. 09/885,780, entitled "INTER-CIRCUIT ENCAPSULATED PACKAGING," by Joseph T. DiBene II and David H. Hartke, filed Jun. 19, 2001, which is a continuation in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

application Ser. No. 09/432,878, entitled "INTER-CIRCUIT ENCAPSULATED PACKAGING FOR POWER DELIVERY," by Joseph T. DiBene II and Dad H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28,2000, which claims priority to the following U.S. Provisional Patent Applications:

application Ser. No. 60/167,792, entitled "EMI CONTAINMENT USING INTER-CIRCUIT ENCAPSULATED PACKAGING TECHNOLOGY," by Joseph T. DiBene II and David H. Hartke, filed Nov. 29, 1999;

application Ser. No. 60/171,065, entitled "INTER-CIRCUIT ENCAPSULATED PACKAGING TECHNOLOGY," by Joseph T. DiBene II and David H Hartke; filed Dec. 16,1999;

application Ser. No. 60/183,474, entitled "DIRECT ATTACH POWER/TERMINAL WITH INCEP," by Joseph T. DiBene II and David H. Hartke, filed Feb. 18, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

application Ser. No. 60/219,813, entitled "HIGH-CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No, 09/785,892, entitled, "METHOD AND APPARATUS FOR PROVIDING POWER TO A MICROPROCESSOR WITH INTEGRATED THERMAL AND EMI MANAGEMENT," by Joseph T. DiBene II, David H. Hartke James J. Hjerpe Kaskade, and Carl E. Hoge, filed Feb. 16, 2001, which claims priority to the following Provisional Patent Applications:

application Ser. No. 60/183,474, entitled "DIRECT ATTACH POWER/THERMAL WITH INCEP," by Joseph T. DiBene II and David H. Hartke, filed Feb. 18, 2000;

application Ser. No. 60/186,769, entitled "THERMA-CEP SPRING BEAM," by Joseph T. DiBene II and David H. Hartke, filed Mar. 3, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,506, entitled "HIGH PERFORMANCE MECHANICAL INTERFACE," by Wendell C. Johnson, David H. Hartke and Joseph T. DiBene II, filed Jul. 20, 2000;

application Ser. No. 60/219,813, entitled "HIGH-CURRENT MICROPROCESSOR POWER DELIVERY SYSTEMS," by Joseph T. DiBene II, filed Jul. 21, 2000;

application Ser. No. 60/21,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, Joseph T. DiBene II, filed Feb. 6, 2001; and application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David a Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING", by Joseph T. DiBene II and David H. Hartke, filed Jul. 15, 1999 and now issued as U.S. Pat. No. 6,304,450, and which claims priority to the following U.S. Provisional Patent Applications:

application Ser. No. 60/183,474, entitled "DIRECT ATTACH POWER/THERMAL WITH INCEP," by Joseph T. DiBene II and David H. Hartke, filed Feb. 18, 2000;

application Ser. No. 60/186,769, entitled "THERMA-CEP SPRING BEAM," by Joseph T. DiBene II and David H. Hartke, filed Mar. 3, 2000;

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,506, entitled "HIGH PERFORMANCE THERMAL MECHANICAL INTERFACE" by Wendell C. Johnson, David H. Hartke and Joseph T. DiBene II, filed Jul. 20, 2000;

application Ser. No. 60/219,813, entitled "HIGH-CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEM," by Joseph T. DiBene II and David H. Hartke, filed Dec. 4, 2000;

application Ser. No. 60/251,223, entitled "MICRO I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001, which is a continuation in part of the following patent applications:

application Ser. No. 09/798,541, entitled "THERMAL/ MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001;

application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

and which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH-CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, which is a continuation in part of the following patent applications:

application Ser. No. 09/798,541, entitled "THERMAL/ MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH-CURRENT MICROPROCESSOR POWER DELIVERY SYSTEMS," by Joseph T. DiBene II, filed Jul. 21, 2000;

application Ser. No. 60/224386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No, 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene II, David H. Hartke, Wendell C. Johnson, Farhad Raiszadeh, Edward J. Darien and Jose B. San Andres, filed Jul. 20, 2001, which is a continuation in part of the following patent applications:

application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian Joseph S. Riel, and Jose B. San Andres, filed Mar. 8, 2001;

application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001;

application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, which claims priority to the following U.S. Provisional Patent Applications:

application Ser. No. 09/432,878, entitled "INTER-CIRCUIT ENCAPSULATED PACKAGING FOR POWER DELIVERY," by Joseph T. DiBene II and David H. Hartke; filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTERCIRCUIT ENCAPSULATED PACKAGING TECHNOLOGY," by Joseph T. DiBene II and David H. Hartke, filed Mar. 8, 2000;

application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

application Ser. No. 60/219,813, entitled "HIGH-CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

application Ser. No. 60/299,573, entitled "MICRO I-PAK STACK UP ARCHITECTURE," by Joseph T. DiBene II, Carl E. Hoge, and David H. Hartke filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001;

application Ser. No. 60/304,930, entitled "MICRO I-PAK," by Joseph T. DiBene II, Carl E. Hoge, David H. Hartke; Edward J. Derian, filed Jul. 11, 2001;

application Ser. No. 09/818,173, entitled "INTER-CIRCUIT ENCAPSULATED PACKAGING," by David H. Hartke and Joseph T. DiBene II, filed Mar. 26, 2001, which is a continuation in part of the following patent applications:

application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David M. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH-CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke filed Dec. 4, 2000;

application Ser. No. 60/251,223, entitled "MICRO I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND A SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

application Ser. No. 60/299,573, entitled "MICRO I-PAK STACK UP ARCHITECTURE," by Joseph T. DiBene II, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl H. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001;

application Ser. No. 60/304,930, entitled "MICRO I-PAK," by Joseph T. DiBene II, Carl E. Hoge, David H. Hartke, Edward J. Derian, filed Jul. 11, 2001;

application Ser. No. 09/921,153 entitled "VAPOR CHAMBER WITH INTEGRATED PIN ARRAY", by Joseph T. DiBene, II and Farhad Raiszadeh, filed on Aug. 2, 2001, which is a continuation in part of the following patent applications:

application Ser. No. 09/921,152, entitled "HIGH SPEED AND HIGH DENSITY CIRCULAR CONNECTOR FOR BOARD-TO-BOARD INTERCONNECT SYSTEMS," by David H. Hartke and Joseph T. DiBene II, filed Aug. 2, 2001;

application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICON- DUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001;

application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke filed Mar. 8, 2001;

application Ser. No. 09/798,541, entitled "THERMAL/ MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727, 016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785, 892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation in part of application Ser. No. 09/353,428, entitled "INTER-CIRCUIT ENCAPSULATED PACKAGING," by, Joseph T. DiBene II and David H. Hartke, filed Jul. 15, 1999 and now issued as U.S. Pat. No. 6,304,450;

application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353, 428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke; filed Apr. 10, 2000;

application Ser. No. 60/219,813, entitled "HIGH-CURRENT MICROPROCESSOR POWER DELIVERY SYSTEMS," by Joseph T. DiBene II, filed Jul. 21, 2002;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251,222, entitled "INTEGRATED POWER DELIVERY WITH FLEX CIRCUIT INTERCONNECTION FOR, HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO I-PAK FOR POWER DELIVERY TO MICROELECTRONICS," by Joseph T. DiBene II and Carl E. Hoge, filed Dec. 4 2000;

application Ser. No. 60/251,184, entitled "MICRO PROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING, FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

application Ser. No. 60/287,860, entitled "POWER TRANSMISSION DEVICE," by Joseph T. DiBene II, David H. Hartke, Carl E. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

application Ser. No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

application Ser. No. 60/299,573, entitled "MICRO I-PAK STACK UP ARCHITECTURE," by Joseph T. DiBene II, Carl E. Hoge, and David H. Hartke, filed Jun. 19, 2001;

application Ser. No. 60/301,753, entitled "INTEGRATED POWER DELIVERY USING HIGH PERFORMANCE LINES REGULATORS ON PACKAGE WITH A MICROPROCESSOR," by Joseph T. DiBene II, Carl E. Hoge, and David H. Hartke, filed Jun. 27, 2001;

application Ser. No 60/304,929, entitled "BORREGO ARCHITECTURE," by David H. Hartke and Joseph T. DiBene II, filed Jul. 11, 2001;

application Ser. No. 60/304,930, entitled "MICRO I-PAK," by Joseph T. DiBene II, Carl E. Hoge, David H. Hartke, Edward J. Derian, filed Jul. 11, 2001; mad application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001, which is a continuation in part of the following patent applications:

application Ser. No. 09/921,153 entitled "VAPOR CHAMBER WITH INTEGRATED PIN ARRAY", by Joseph T. DiBene II and Farhad Raiszadeh, filed on Aug. 2, 2001;

application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene II, David H. Hartke, Wendell C. Johnson, Farhad Raiszadeh, Edward J. Darien and Jose B. San Andres, filed Jul. 20, 2001;

application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

application Ser. No. 09/798,541, entitled "THERMAL/ MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke; filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

and which claims priority to the following U.S. Provisional Patent Applications:

application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

application Ser. No. 60/219,813, entitled "HIGH-CURRENT MICROPROCESSOR POWER DELIVERY SYSTEMS," by Joseph T. DiBene II, filed Jul. 21, 2000;

application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

application Ser. No. 60/22,407, entitled "VAPOR HEATSINK COMBINATION FOR HIGH EFFICIENCY THERMAL MANAGEMENT," by David H. Hartke and Joseph T. DiBene II, filed Aug. 2, 2000; and application Ser. No. 60/232,971, entitled "INTEGRATED POWER DISTRIBUTION AND SEMICONDUCTOR PACKAGE," by Joseph T. DiBene II and James J. Hjerpe, filed Sep. 14, 2000;

application Ser. No. 60/251 222, entitled "INTEGRATED POWER DELIVERY WITH FLEX CIR- CUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

application Ser. No. 60/251,223, entitled "MICRO I-PAK FOR POWER DELIVERY TO MICROELECTRONICS," by Joseph T. DiBene II and Carl E. Hoge, filed Dec. 4, 2000;

application Ser. No. 60/251,184, entitled "MICROPROCESSOR INTEGRATED PACKAGING," by Joseph T. DiBene II, filed Dec. 4, 2000; and application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

application Ser. No. 60/287,860, entitled "POWER TRANSMISSION DEVICE," by Joseph T. DiBene II, David H. Hartke, Carl S. Hoge, and Edward J. Derian, filed May 1, 2001;

application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

application Ser. No. 60/291,772, entitled "I-PAK ARCHITECTURE POWERING MULTIPLE DEVICES," by Joseph T. DiBene II, David H. Hartke Carl E. Hoge, and Edward J. Derian, filed May 16, 2001;

application Ser. No. 60/292,125, entitled "VORTEX HEAT SINK FOR LOW PRESSURE DROP HIGH PERFORMANCES THERMAL MANAGEMENT ELECTRONIC ASSEMBLY SOLUTIONS," by Joseph T. DiBene II and Farhad Raiszadeh, filed May 18, 2001;

application Ser. No. 60/299,573, entitled "MICRO I-PAK STACK UP ARCHITECTURE," by Joseph T. DiBene II, Carl E. Hoge, and David H. Hartke, filed Jun. 19, 2001;

application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

application Ser. No. 60/304,929, entitled "BORREGO ARCHITECTURE," by David H. Hartke and Joseph T. DiBene II, filed Jul. 11, 2001;

application Ser. No. 60/304,930, entitled "MICRO I-PAK," by Joseph T. DiBene II, Carl E. Hoge, David H. Hartke, Edward J. Derian, filed Jul. 11, 2001.

BACKGROUND OF THE INVENTION

1. Field of the Invention

The present invention relates generally to systems and methods for interconnecting electronic packages and in particular to a power interconnection system mating between substrates to enable a low impedance disconnectable power delivery path between the power source and the load of an electronic package.

2. Description of the Related Art

High-speed microprocessor packaging must be designed to provide increasingly small form-factors. Meeting end user performance requirements with minimal form-factors while increasing reliability and manufacturability presents significant challenges in the areas of power distribution, thermal management, and electromagnetic interference (EMI) containment.

To increase reliability and reduce thermal dissipation requirements, newer generation processors are designed to operate with reduced voltage and higher current. Unfortunately, this creates a number of design problems.

First, the lowered operating voltage of the processor places greater demands on the power regulating circuitry and the conductive paths providing power to the processor. Typically, processors require supply voltage regulation to within 10% of nominal. In order to account for impedance variations in the path from the power supply to the processor itself, this places greater demands on the power regulating circuitry, which must then typically regulate power supply voltages to within 5% of nominal.

Lower operating voltages have also lead engineers away from centralized power supply designs to distributed power supply architectures in which power is bused where required at high voltages and low current, where it is converted to the low-voltage, high-current power required by the processor from nearby power conditioning circuitry.

While it is possible to place power conditioning circuitry on the processor package itself, this design is difficult to implement because of the unmanageable physical size of the components in the power conditioning circuitry (e.g. capacitors and inductors), and because the addition of such components can have a deleterious effect on processor reliability. Such designs also place additional demands on the assembly and testing of the processor packages as well.

Further exacerbating the problem are the transient currents that result from varying demands on the processor itself Processor computing demands vary widely over time, and higher clock speeds and power conservation techniques such as clock gating and sleep mode operation give rise to transient currents in the power supply. Such power fluctuations can require changes of thousands of amps within a few microseconds. The resulting current surge between the processor and the power regulation circuitry can create unacceptable spikes in the power supply voltage $$\left( \text{e.g.} \quad dv = IR + L\frac{di}{dt} \right).$$

The package on which the device (die) typically resides must be connected to other circuitry in order for it to communicate and get power into and out of the device. Because the current slew-rates may be very high, a low impedance interconnection system is often needed to reduce voltage excursions between the power source and load which, if left unchecked, may cause false switching due to the reduced voltage seen at the load from a large voltage drop across the interconnect.

The technology of vertically stacking electronic substrates has been utilized for a number of years. As one example, U.S. Pat. No. 5,734,555, issued to McMahon (which is hereby incorporated by reference herein) discloses a method by which a circuit board containing power conversion elements is coplanar located over a circuit board containing an integrated circuit. The interconnect between the power conversion substrate and the integrated circuit substrate utilizes pins which do not provide a low impedance power path to the integrated circuit. Further, the McMahon device cannot be easily disassembled because the pins are permanently connected to the substrates. As another example, U.S. Pat. No. 5,619,339, (which is hereby incorporated by reference herein) issued to Mok discloses a printed circuit board (PCB) is vertically displaced over a multi-chip module (MCM) with electrical communication between the two substrates (the PCB and the MCM) established by a compliant interposer which contains "fuzz buttons" which communicate with pads located on each substrate. Although such an approach does provide for disassembly of the two substrates, e.g., the MCM and the PCB, the approach does not provide for large 'Z' axis compliance to accommodate manufacturing tolerances, and does not teach the use of a contact design that is capable of handling large amounts of DC current. Further, this design requires the use of a compliant interposer. In order to handle such large amounts of current, the number of contacts would have to be increased dramatically, which would increase the inductance between the source and the load device. Furthermore, such a large array of such contacts would require a large amount of force to be applied to maintain contact and will not result in a space-efficient design.

From the foregoing, it can be seen that there is a need for a low impedance power interconnect between the power dissipating device and the power source. It can also be seen that this impedance must be low in inductance and resistance throughout a wide frequency band in order to ensure that the voltage drops across the interconnect are mitigated across it during dynamic switching of power. It can also be seen that the interconnect should provide large 'z' axis compliance.

SUMMARY OF THE INVENTION

To address the requirements described above, the present invention discloses an apparatus for providing power to a power dissipating device. The apparatus comprises a first circuit board and a second circuit board, and a plurality of compressible or non-compressible conductors disposed between first circuit board and the second circuit board.

The first circuit board includes a power conditioner circuit, and a first side and a second side having a plurality of first circuit board contacts thereon. The first circuit board contacts include a first set of first circuit board contacts communicatively coupled to a first power conditioner circuit connector and a second set of first circuit board contacts communicatively coupled to a second power conditioning circuit connector;

The second circuit board includes the power dissipating device mounted thereto; a plurality of second circuit board contacts disposed on a first side of the second circuit board facing the second side of the first circuit board. The second circuit board also includes a first set of second circuit board contacts communicatively coupled to a power dissipating device first connector and a second set of second circuit board contacts communicatively coupled to a second connector of the power dissipating device.

The plurality of z-axis compressible conductors includes a first set of z-axis compressible conductors disposed between the first set of first circuit board contacts and the first set of second circuit board contacts and a second set of z-axis compressible conductors disposed between the second set of first circuit board contacts and the second set of second circuit board contacts.

The first set of first circuit board contacts, the first set of z-axis compressible conductors, and the first set of second circuit board contacts define a plurality of first paths from the first circuit board to the second circuit board and wherein the second set of circuit board contacts, the second set of z-axis compressible conductors, and the second set of second circuit board contacts define a plurality of second paths from the first circuit board to the second circuit board.

The present invention provides a spring-like structure which disconnectably connects between two or more substrates (such as a printed circuit board or IC package) whereby the connection is disconnectable at least on one of the two sides. The interconnection system provides for an extremely low impedance through a broad range of frequencies and allows for large amounts of current to pass from one substrate to the next either statically or dynamically. The interconnection system may be located close to the die or may be further away depending upon the system requirements. The interconnection may also be used to take up mechanical tolerances between the two substrates while providing a low impedance interconnect. Due to the low impedance connection, the design permits the displacement of bypass capacitors on the circuit board having the power dissipating device, and placement of these capacitors on the circuit board having the power conditioning circuitry, resulting in ease of manufacturing and improved reliability of the power dissipating device assembly.

The present invention reduces or eliminates the need for supporting electronic components for the power dissipating device on the substrate, since the interconnect impedance between the power source and the electronic device is sufficiently low so that all or most of the supporting electronics can be located on the substrate containing the power source. Since the present invention does not use any socket connectors to supply power to the device, such socket connectors are freed to provide additional signals.

BRIEF DESCRIPTION OF THE DRAWINGS

Referring now to the drawings in which like reference numbers represent corresponding parts throughout:

FIG. 4 is a diagram showing an embodiment of a cantilever beam that may be used to implement the z-xis compliant contacts;

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

The present invention describes a low impedance interconnection system operably placed between the two substrates whereby the interconnect is either placed to one side of the device or devices or circumferentially surrounds these elements.

When a load change occurs in operation on one of these devices, a voltage will occur across the interconnect that can be described as shown below:

$$\Delta V = L \frac{\partial I_{Step}}{\partial t} + R I_{Step}$$

wherein $\Delta V$ is the voltage across the interconnection system, L is the series loop inductance of the interconnect, R is the interconnect resistance, and $I_{step}$ is the step-change in load current.

As shown above, the output voltage change $\Delta V$ increases linearly with the loop inductance L. Further, where rapidly changing currents are involved (as is the case with step changes in current, it is critically important that the interconnect system provides for a low inductance between the two substrates. During such a current step, reducing the loop inductance L reduces the $\Delta V$ that results from current changes, thus allowing power to be efficiently delivered from the current source to the load.

Figure 1A:
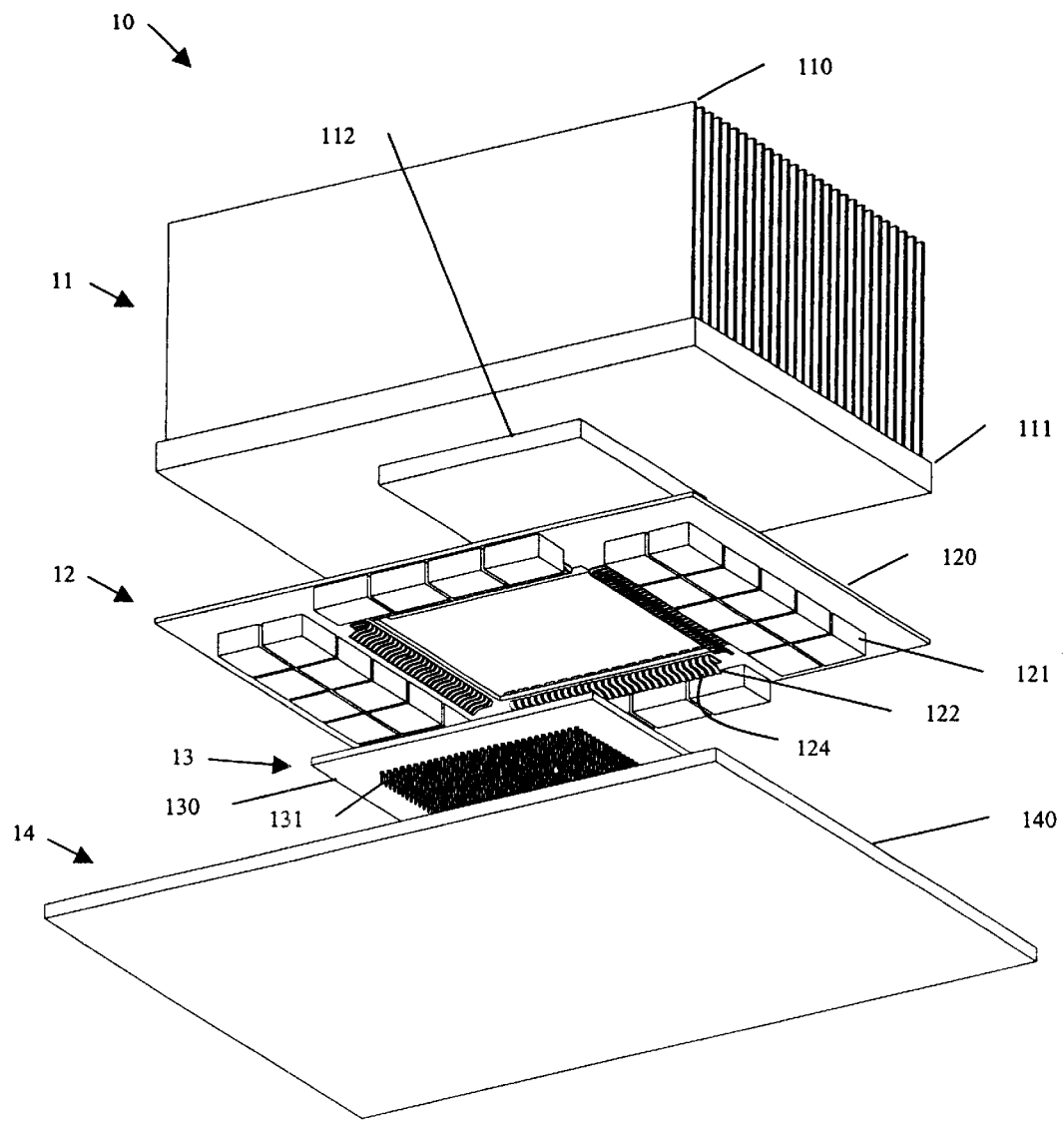
FIGS. 1A and 1B are diagrams showing exploded views of the interconnection system as placed between two substrates, e.g., a voltage regulator module (VRM mounted over power dissipating device.
Figure 1B:
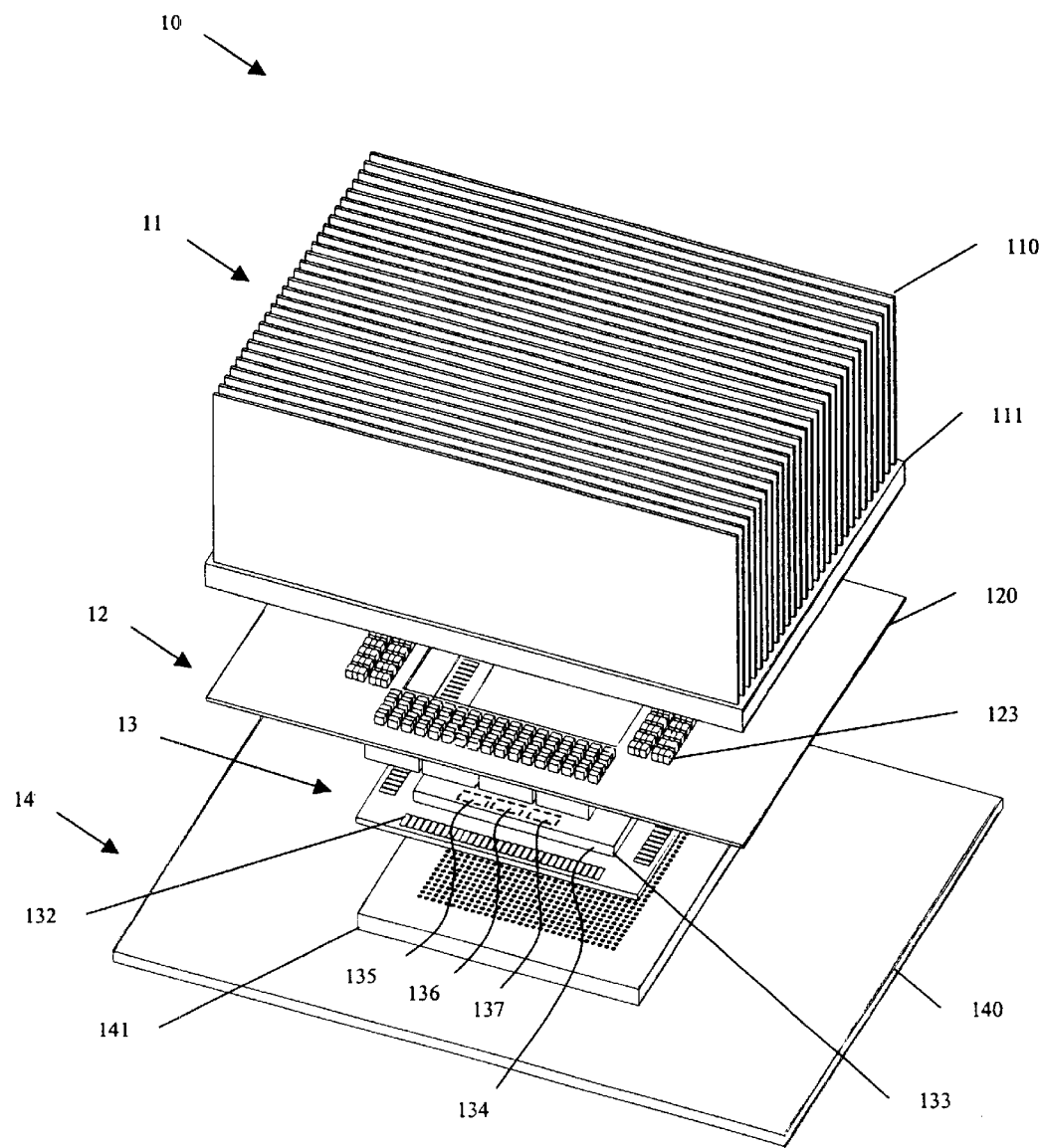

FIGS. 1A and 1B are diagrams illustrating a structure 10 which provides a power path from a power conditioning circuit to a high performance electronic power dissipating device via a plurality of paths, thus yielding very low impedance. The structure 10 comprises a main board assembly 14, an electronic assembly 13 having a high performance electronic power dissipating device, a power conversion assembly 12 and a heat dissipating assembly 11.

The electronic assembly 13 comprises a power dissipating device such as a microprocessor 134 assembled onto circuit board or substrate 130. The circuit board 130 includes one or more circuit traces which deliver power to the die of the microprocessor 134. The circuit board 130 also includes circuit traces which route signals to a matrix of pins 131 communicatively coupled to microprocessor 134 I/O connectors. The microprocessor 134 is typically provided with a thermally conductive lid 133 in which the inside surface of the lid is in close thermal contact with the top of the die of the electronic device and the perimeter of the lid is sealed and attached to the surface of the substrate 130. Although the package described herein is provided with a lid the present invention does not preclude the use of unlidded package construction methods.

The signal pins 131 engage with a socket 141 which is mounted to a main board 140 both of which are a part of main board assembly 14. Signals from the main board assembly 14 are dispersed to other electronic devices to form a complete operating unit such as a computer. Other methods may be employed to route the signals from the substrate 130 to the main board 140 which may not utilize either pins or sockets.

The circuit board 130 includes a plurality of contacts 132. The contacts 132 can include power contacts and/or ground contacts. The power and ground contacts are communicatively coupled to power connectors or pads 135–137 of the power dissipating device 134, respectively.

Figure 1C:
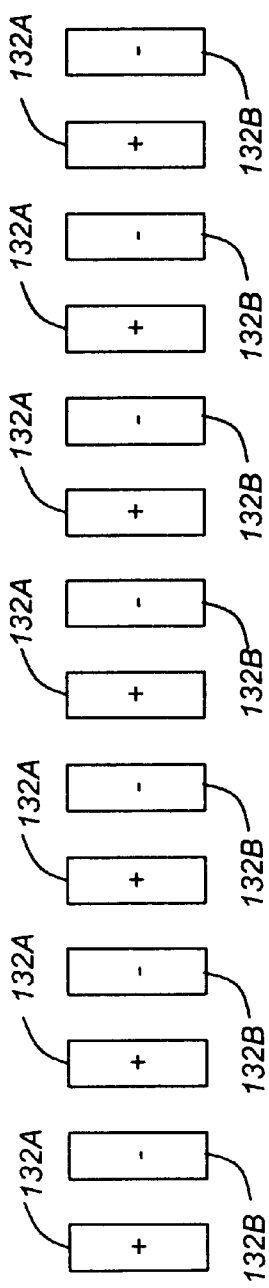
FIGS. 1C–1E are diagrams showing different embodiments of the contacts.
Figure 1D:
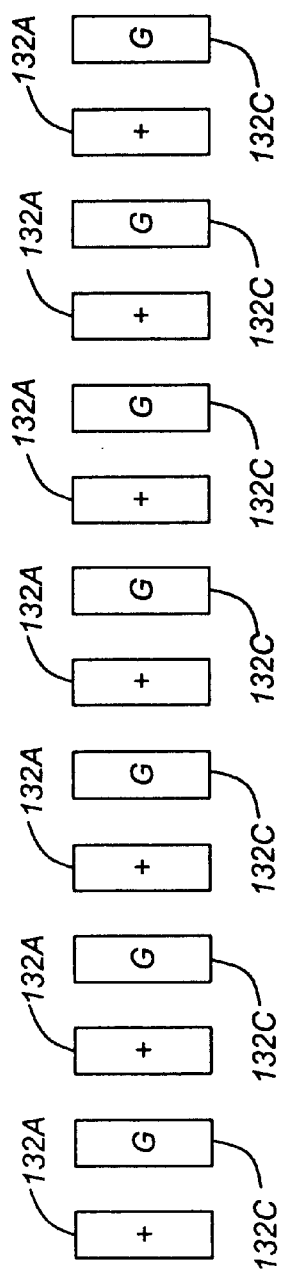
Figure 1E:
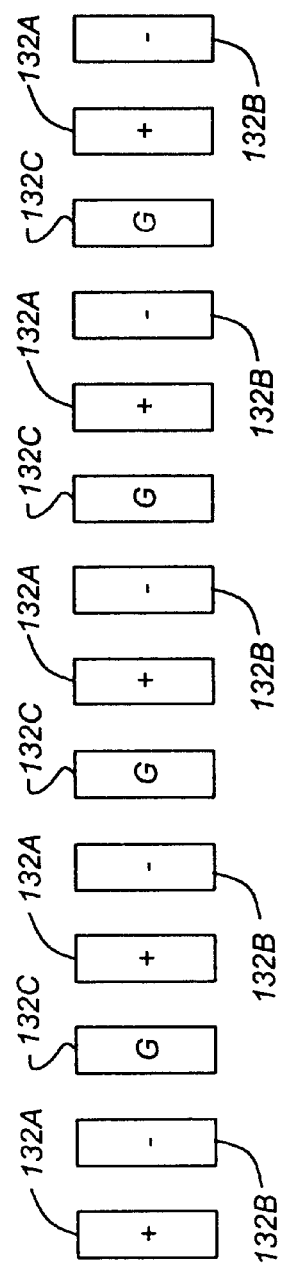

FIGS. 1C–1E disclose several embodiments of the present invention showing different arrangements of the contacts 132. In one embodiment, the power contacts include positive polarity power contacts 132A that are communicatively coupled to a positive polarity power connector or pad 135 on the power dissipating device 134 and negative polarity power contacts 132B that are communicatively coupled to a negative polarity power connector or pad 136 on the power dissipating device 134. The ground contacts 132C are communicatively coupled to a ground connector or pad 137 of the power dissipating device 134.

In one embodiment of the present invention (illustrated in FIGS. 1D and 1E), the power contacts 132A and/or 132B are interleaved with the ground contacts 132C. In FIG. ID, each power contact 132A and/or 132B is adjacent a ground contact 132C, and each ground contact 132C is adjacent a power contact 132A and/or 132C. In another embodiment of the present invention, the positive polarity power contacts 132A are interleaved with negative polarity power contacts 132B in the same way. The foregoing interleaved or alternating design substantially reduces undesirable electrical impedance of the power path.

In the embodiments shown in FIGS. 1A and B, the contacts 132 are disposed around the perimeter of the electronic device and are a part of the substrate structure 130.

The substrate 130 generally comprises a number of conductive layers which are used to route both signals and power and ground. When routing power, layer pairs adjacent to each other form a very low electrical interconnect impedance between the power pads 132 and the die power and/or ground connectors (e.g. pads) of the electronic device 134. These layer pairs are connected to the power pads 132 in a closely coupled arrangement to the planes. A further description of the conductive layers and their arrangement with respect to the z-axis compressible conductors 124 is presented in conjunction with FIGS. 3A–3C below.

A power conversion assembly 12 is disposed directly above (along the z-axis) the electronic assembly 13. This assembly 12 comprises an interconnect substrate commonly referred to as a printed circuit board (PCB) 120, a power conversion circuit having components 121 such as switching transistors, transformers, inductors, capacitors, and control electronics; output capacitors 123 and a compliant conductor assembly 122 having a plurality of z-axis compressible conductors 124. These power conversion components can be segmented according to the VRM circuit topology to optimize the impedance and power flow through the power conditioning circuitry. For example, in the case of a multiphase VRM, the topology of the VRM can be designed to provide one or more of the phases, each at the appropriate connector, thus minimizing the interconnect impedance and the required circuit board real estate. The plurality of z-axis compressible conductors 124 circumscribe and interface with the contacts 132 on the electronic assembly 13 to provide a conductive path between the power conversion assembly 12 and the electronic assembly 13 having very low inductance. Further, the conductor assembly 122 permits the power conversion assembly 12 and the electronic assembly 13 to be disassembled and separated without desoldering.

In the illustrated embodiment, the conductors 124 of the conductor assembly 122 are attached (e.g. soldered or bonded) to the substrate 120. Further, the conductors 124 of the conductor assembly 122 are electrically coupled to the contacts 132 of substrate 130 through mechanical pressure applied to urge the substrate 120 towards the substrate 130 the conductors 124.

Other variations of this structure are possible. As an example, the compliant conductor assembly 122 could be permanently attached to substrate 130 with contact pads on substrate 120 or, contact pads could be place on both substrates 120 and 130 and the compliant contact could provide pressure contacts to both substrates. Note that some of the interconnect compliant contacts may be used for control and sense interfaces between the power circuitry in assembly 12 and the electronic assembly 13. Finally, note that substrate 120 has an aperture to allow for the lid 133 to pass through and thermally couple to the heatsink assembly 11.

In the past, it has been necessary to position bypass capacitors on substrate 130 to provide for the transient current demands of the electronic device on the substrate. This has reduced the reliability of the electronic assembly 12 which is relatively much more expensive than the other assemblies. Thus, it is desirable to increase the reliability of this assembly to the highest degree possible. Because the interconnect inductance of the compliant contacts 122 is extremely low it is possible to position the necessary bypass capacitors 123 on the power conversion substrate 120. Further, note that these capacitors 123 are located directly above the conductor assembly 122 reducing the interconnect path length between the connector and the capacitors 123 (thus decreasing the impedance) to approximately the thickness of the substrate 120.

Heatsink assembly 11 is used to remove heat from both the electronic assembly 13 and the power conversion assembly 12. Heatsink assembly 11 comprises a finned structure 100 which is attached or is a part of base 111. Heat slug or mesa 112 is attached to or is a part of base 111 and is used to both disperse heat from the lid 122 and to mechanically conform to the proper vertical displacement between the lid of the microprocessor 134 and the heat sink base 111. Thermal interface materials may be used to thermally couple the lid 133 and the mesa 112 to the heatsink base 111 and the substrate 120/power components 121. The heatsink base 111 may also comprise cavities to accommodate any components on the top side of substrate 120 such as capacitors 123.

Figure 2A:
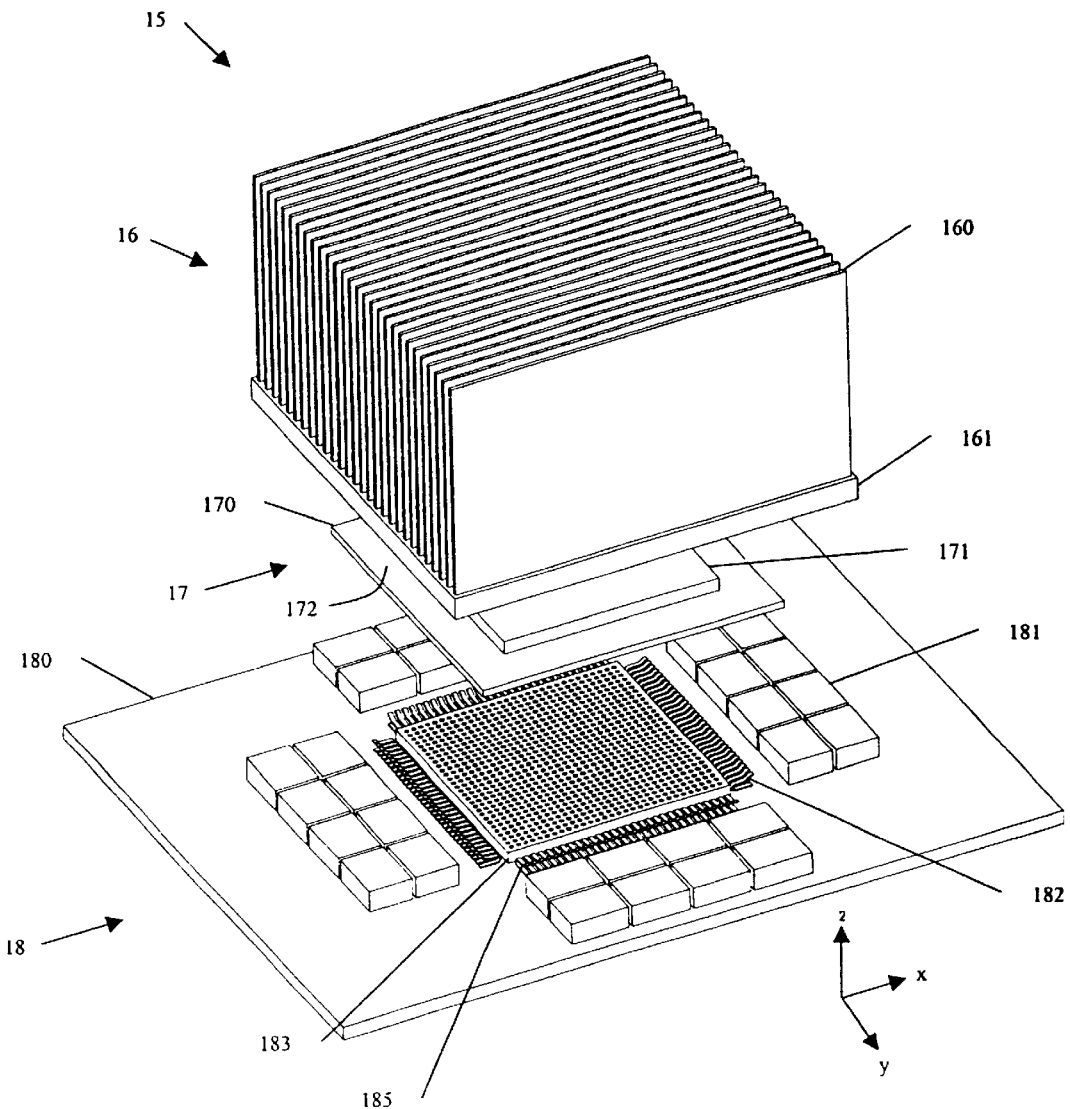
FIGS. 2A and 2B are diagrams showing exploded views of the interconnection system as placed between a processor substrate and a motherboard, the interconnection system occurring on the sides of the processor substrate.
Figure 2B:
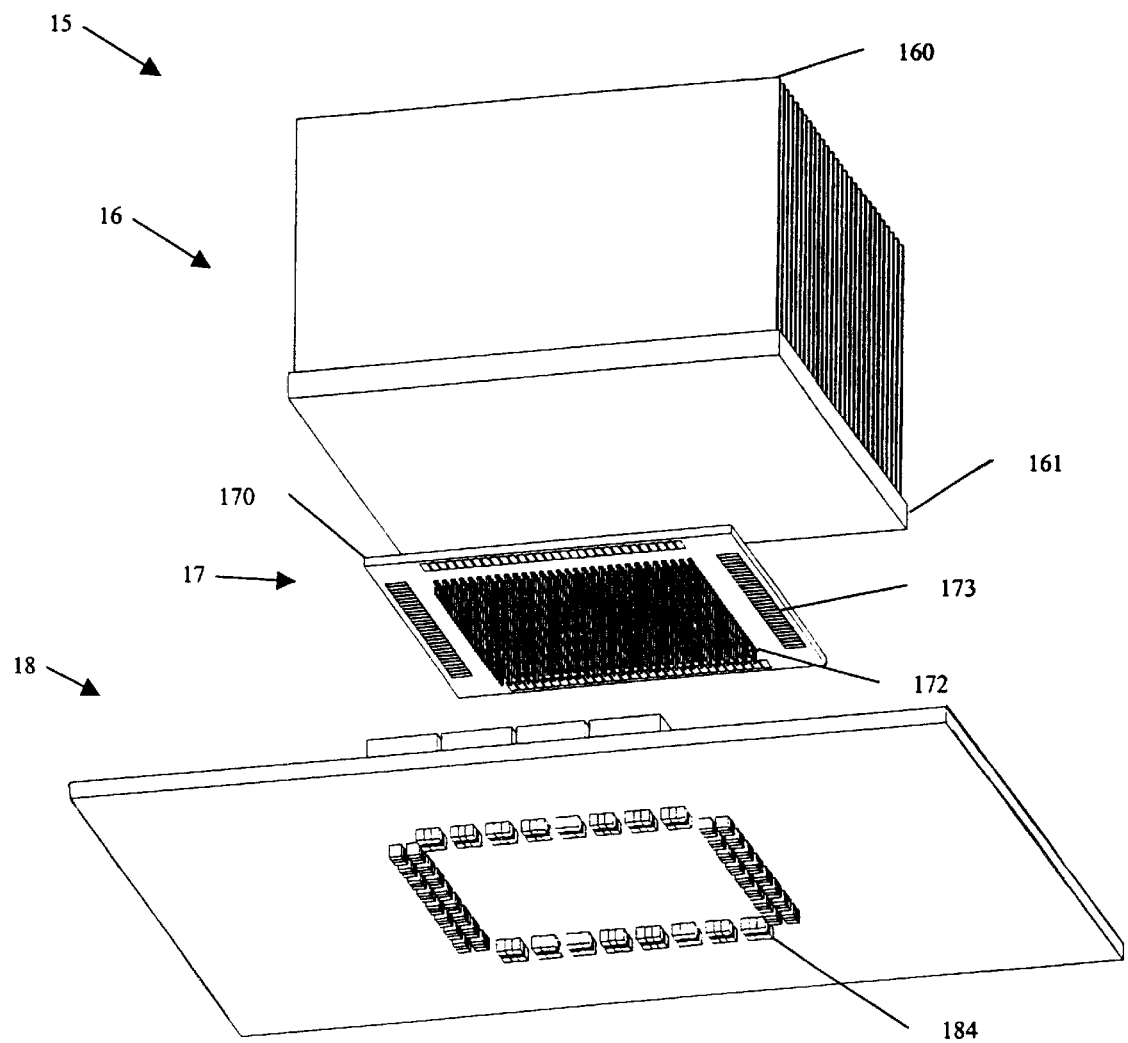

FIGS. 2A and 2B illustrate a structure 15 which is similar to structure 10 except the power conversion circuit components are located directly on the main board assembly 18. The structure comprises the main board assembly 18, a high performance electronic assembly 17 and a heat dissipating assembly 16.

Electronic assembly 17 is similar to electronic assembly 13 with substrate 170, lid 171 and pin matrix 172. However, contacts 173, which can be used as power pads, are located on the bottom side of substrate 170. In the illustrated embodiment, the contacts are disposed around the perimeter of the electronic device 172.

Main board assembly 18 comprises a main board 180 with power conversion components 181 making up a power conditioner circuit and compliant conductor assembly 182 having a plurality of z-axis compressible conductors 185 circumscribing a socket 183. As was the case with assembly 13, bypass capacitors 184 are placed on main board 180 directly under and in electrical communication with the z-axis compressible conductors 185. Heat sink assembly 16 is disposed above and is thermally coupled to the electronic assembly 17. The heat sink assembly 16, which removes heat from the electronic assembly 17, comprises a finned structure 160 and base 161.

Thermal interface material can be used between the base 161 and the lid 171 to thermally couple the base 161 and the lid 171. Thermal energy may also be removed from the power conversion components 181. This can be accomplished by providing a thermal conduction path from the bottom of the main board to an adjacent chassis surface. This can also be accomplished by simply providing sufficient airflow around these components so as to directly cool them. It is also noted that as was the case with the embodiments illustrated in FIGS. 1A and 1B, where ultimate electrical performance is not needed, compliant conductor assembly 182 and power components 181 may not need to circumscribe socket 183 and may be located on less than all four sides of socket 183.

Figure 3A:
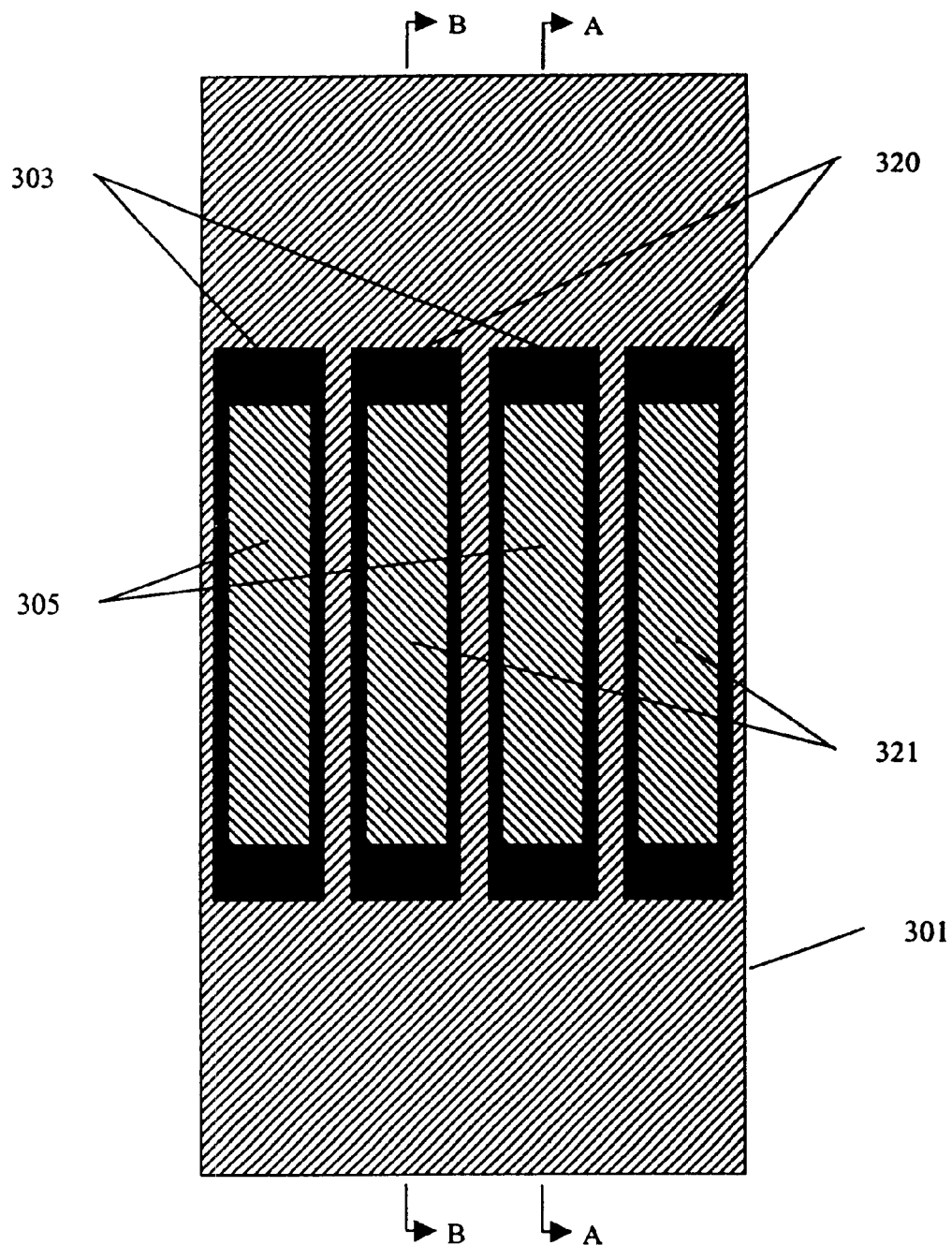
FIGS. 3A–3C are diagrams showing a simple stackup cross-section of the interconnection system as placed between two substrates.
Figure 3B:
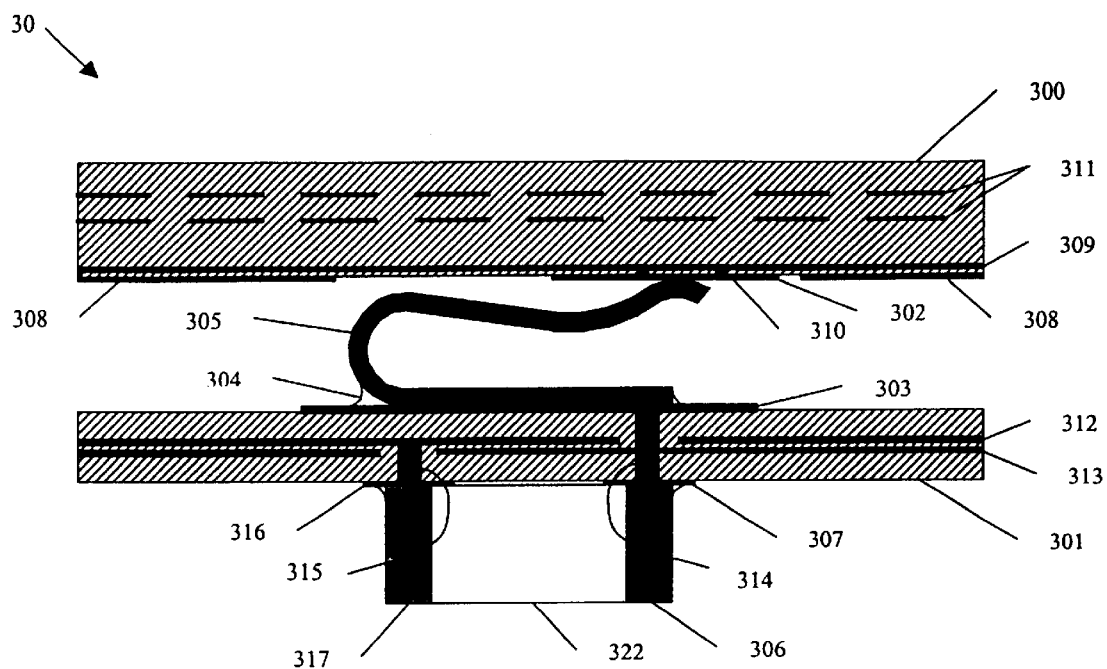
Figure 3C:
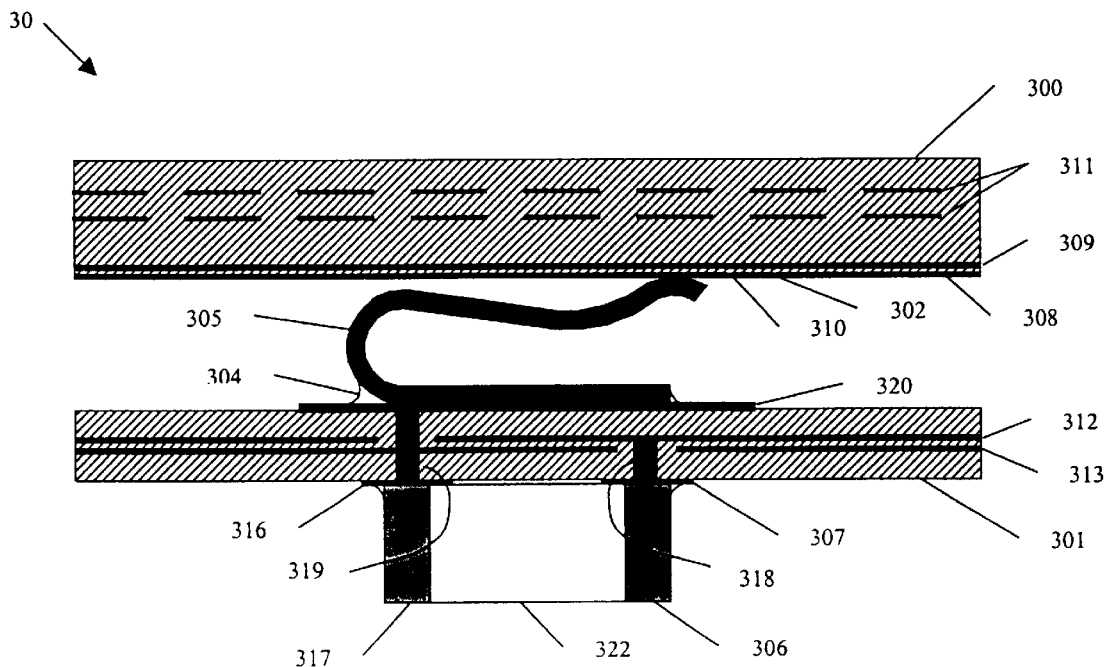

FIGS. 3A–3C illustrate one method in which a stackup 30 is configured to deliver power from a power conversion PCB 301 to a processor substrate 300. It will be recalled that a preferred embodiment of power delivery is to deliver power through alternating or interleaved contacts so as to reduce the interconnect impedance.

FIG. 3A is a plan view of the stackup 30 with the upper PCB 300 removed, showing the arrangement of adjacent z-axis compressible conductors 305 and 321 in the x-y plane. In one embodiment illustrated, the conductors are spaced approximately 50 mils apart, to decrease impedance. Further, the illustrated z-axis compressible (or, equivalently, compliant) conductors 305 and 321 are cantilevered beams having bases that are soldered or other wise affixed to contacts (or circuit pads) 303 and 320, respectively. The other end of the compliant contact is pressed against the contact (or circuit pad) of the upper circuit board 300.

FIG. 3B illustrates a cross section (A—A) of one polarity of power delivery, e.g., the positive polarity, while FIG. 3C illustrates a cross section (B—B) of the negative polarity, the two sections adjacent to one another forming the preferred interleave pattern. Now, referring to FIG. 3B, power conversion PCB 301 contains power layers 312 and 313 wherein layer 312 represents the negative power layer and layer 313 represents the positive power layer the two of which are in close proximity to one another to effect a low impedance power interconnect. A plated through hole (PTH) 314 or similar conductor connects the layer 313 to surface pad 303. Z-axis compliant contact 305 is shown as a cantilever beam in which the base is soldered 304 to surface pad 303 while the other end of the compliant contact 321 is pressed against circuit pad 302 which is on substrate 300. Located directly below the compliant contact 305 is bypass capacitor 322 with conductive end metalization features 306 and 317 which are surface mounted to pads 307 and 316 on PCB 301. Circuit pad 307 is connected to layer 313 through an extension of PTH 314. Circuit pad 316 is connected to layer 312 through blind via 315. On substrate 300 layer 308 is assigned the negative power polarity while layer 309 is assigned the positive power polarity and, like layers 312 and 313, are in close proximity to one another to achieve a low impedance power interconnect. The power dissipating device is also located on substrate 300 and receives power through layers 308 and 309. Circuit pad 302 is connected to layer 309 through blind vias 310 thus forming the interconnect from layer 313 through PTH 314 to pad 303 then through compliant contact 305 to pad 310 and then through blind vias 310 to layer 309. Note that layers 308 and 309 are located on or near the surface of substrate 300. This frees the substrate to use the other layers represented here as layers 311 for signal interconnect for the power dissipating device.

Now referring to FIG. 3C, the negative power interconnect is achieved by PTH 319 connecting layer 313 to surface pad 320. Compliant contact 321 is soldered 304 to surface pad 320 while the other end of the compliant contact 321 is pressed against plane 308 of substrate 300. Note that contact point for compliant contact 321 is shown as a point on plane 308 however, this contact point may be a unique area of plane 308 in which the surface is locally processed to provide special characteristics for this contact point such as gold plating over a nickel undercoat to improve the contact characteristics of the contact. Surface pad 310 may be processed in a similar manner. Finally, capacitor 322 may be the same bypass capacitor as shown in FIG. 3B or an additional bypass capacitor connected to planes 312 and 313 through an extension of PTH 319 to surface pad 316 and blind via 318 to surface pad 307. The result of the above is to provide a very low compact and low inductance compliant connection between PCB 301 and substrate 300 with the two substrates being separable. Furthermore, because the interconnection method provides for a very low inductance connection it is possible to either eliminate or considerably reduce bypass capacitors on the substrate 300 containing the power dissipating device.

Because such substrates are constructed such that the interconnects between layers 308 and 309 are blind vias 310 which pass only between layer to layer and not through the entire substrate, signal layers 311 and additional power/ground layers (if any) will not be permeated with large numbers of via interconnects (such as 310) as would be if power entered from the top side of substrate 300. This has the benefit of freeing up signal routing space in these layers (such as 311) where the number of via interconnects are substantially reduced due to the entrance of power to the bottom side of substrate 300.

FIGS. 4A and 4B illustrate an isometric view of one embodiment of a U-shaped z-axis compressible conductor 40. The conductor 40 comprises a base 401 which can be soldered or otherwise bonded to a substrate while contact surface 400 is pressed against a pad on an opposite substrate. FIG. 4A shows the conductor 40 in the uncompressed state while FIG. 4B shows the conductor in the compressed state. In the illustrated embodiment, the contact surface 400 is formed by an S-shaped portion having a curved surface. The curved surface assures that the conductor 40 presents a surface parallel to the circuit board above the contact 40.

Figure 5B:
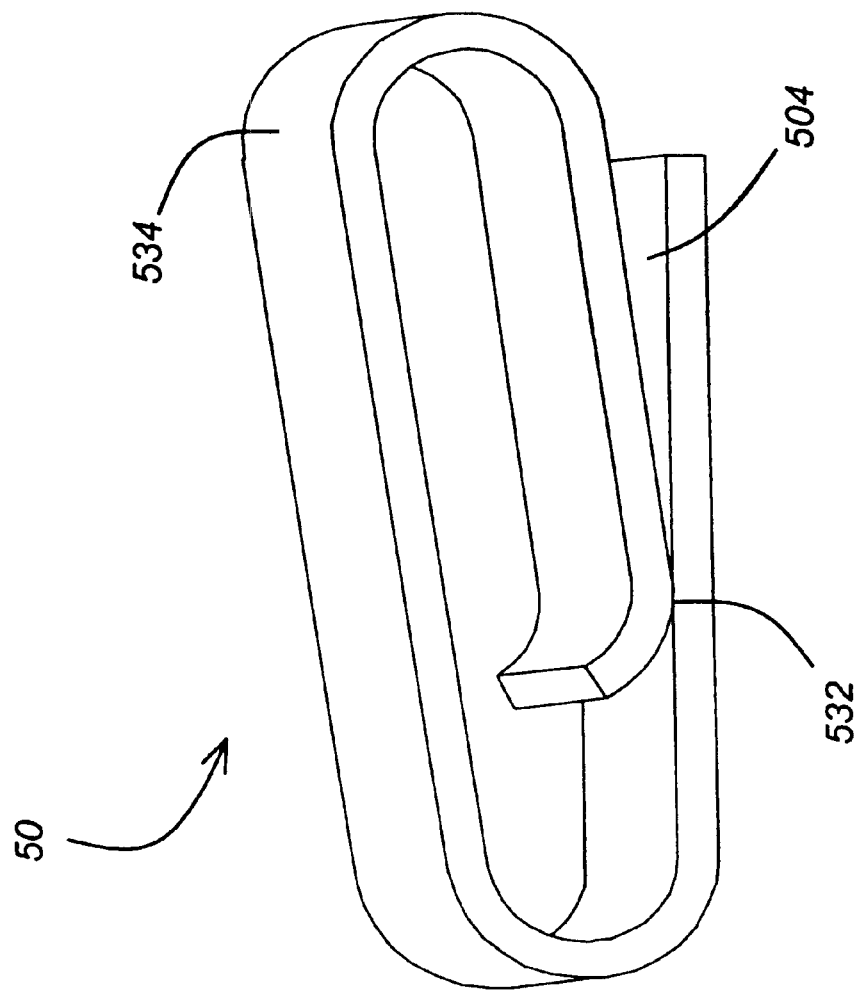
FIG. 5 is a diagram showing an further embodiment of a cantilevered beam in which a feature of the beam is utilized to reduce the connection inductance of the compliant contacts.

FIGS. 5A and 5B illustrate an isometric view of another embodiment of the z-axis compressible conductor 50. This embodiment has improved (reduced) connection inductance compared to the embodiment illustrated in FIGS. 4A and 4B. The conductor has a base or first shaft portion 502 having a first end 504 and a second end 506 distal from the first end 504. The base 502 is generally soldered to a substrate contact. A U-shaped bend portion 508 is coupled to the first shaft portion 502. The U-shaped bend portion 508 includes a first end 510 adjacent and coupled to the first shaft portion second end 506 and a second end 512. A second shaft portion 514 is coupled to the U-shaped bend portion 508. The second shaft portion includes a first end 516 adjacent and coupled to the U-shaped portion second end 512. Second shaft portion is adjacent and coupled to a second U-shaped bend portion 520. The second U-shaped bend portion comprises a first end 522 adjacent and coupled to the second end 518 of the second shaft portion 514 and a second end 524. The second U-shaped bend portion is adjacent and coupled to a third shaft portion 526 disposed between the first shaft portion 502 and the second shaft portion 514. The third shaft portion 526 includes a first end 528 adjacent and coupled to the second end of the second U-shaped bend portion 520 and a second end 530 distal from the first end 528. Bend portion 502 is disposed at the second end 530.

The conductor contact surface 534 is pressed against a pad on an opposite substrate. The contact beam is then wrapped around and returns to the upper surface of base 502 forming a secondary contact 536 to the base 502. Since the mutual coupling between the two paths is relatively low, a significant reduction in interconnect inductance can be achieved with this conductor arrangement.

Individual conductors can be grouped so as to ease assembly of the conductor onto a PCB or substrate using soldering or other joining processes. One method is to extend a surface feature (such as 401) of the conductor to an area outside of the active portion of the conductor which is joined to a common bat during the stamping and forming fabrication process and then to overmold this extended feature with an insulating plastic resin up to the common bar but not including the bar. The bar is then cut off leaving a set of individual isolated contacts which are mechanically joined and can be handled during assembly as one unit as in FIG. 6. However, unlike the embodiment shown in FIG. 6, the extended surface feature must cut off to create individual contacts.

Figure 6A:
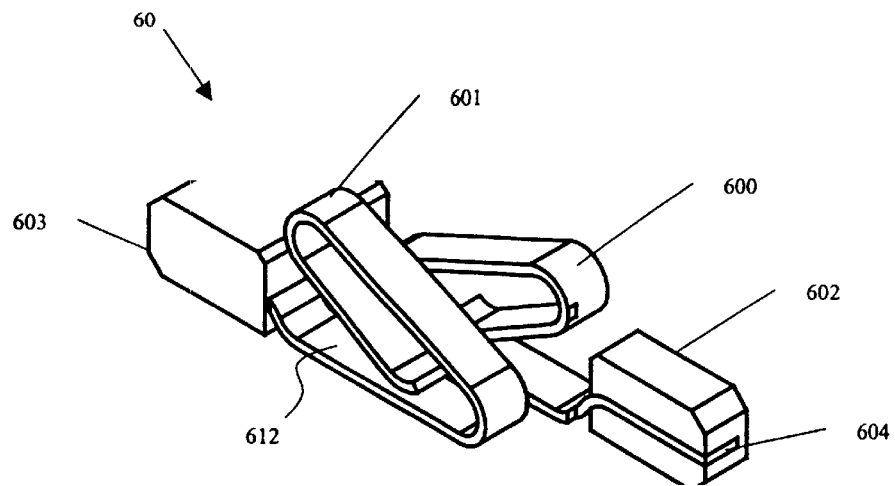
FIG. 6A is a diagram presenting an isometric view of a pair of scissor spring contacts.

FIG. 6A illustrates an isometric view of a pair of spring contacts 60 similar to that shown in FIG. 5A and 5B in which a row of contacts 601 is arranged facing a row of contacts 600 in a scissor configuration, The base 612 of each contact row is extended to overmolds 602 and 603 as described in the preceding paragraph to simplify assembly. In this arrangement, overmolds 603 and 604 would desirably be joined at their respective ends to form one assembly. An advantage of this configuration is that there is no resulting net torsional force.

Figure 6B:
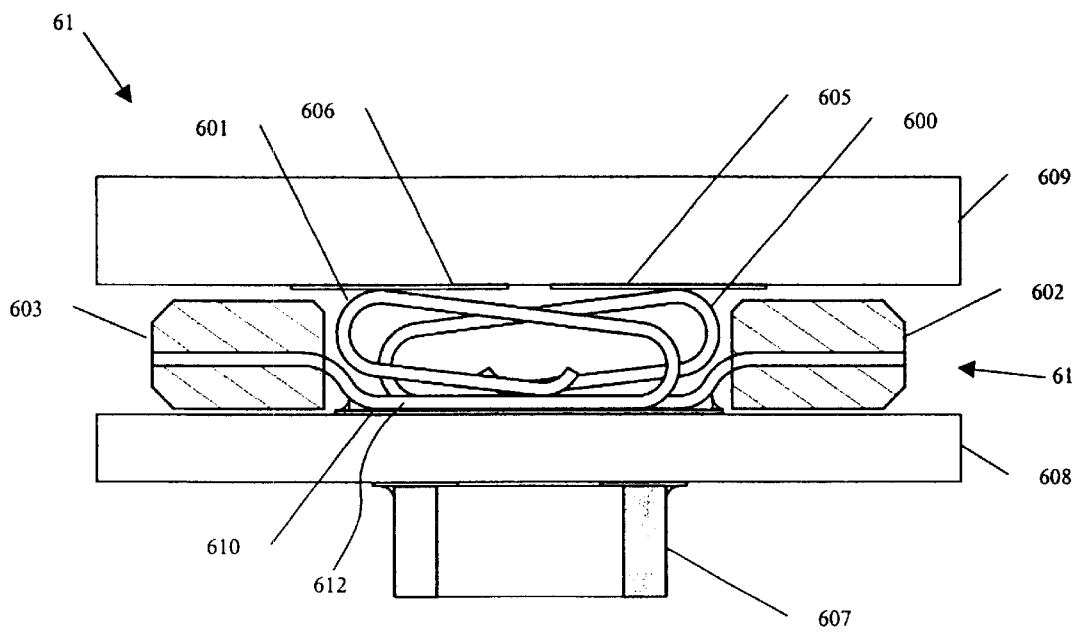
FIG. 6B is a diagram presenting a view of a pair of scissor spring contacts in conjunction with a cross section of the stackup interconnection system as placed between two substrates.

FIG. 6B illustrates an example where the scissor contact described above can be arranged in a stackup 61 to deliver power from a power conversion PCB 608 to a processor substrate 609. Each row of assembly 60 would preferably be assigned a separate power polarity, e.g., row 601 might be assigned negative power polarity and row 600 might be assigned a positive power polarity. Then, since the two rows are interlaced they would form contact pairs of power delivery resulting in a low inductance power path. The circuit pads 610 on PCB 608 will require isolation between adjacent pads since they will have alternating positive and negative power polarities. However, of significant importance is that contacting pads 605 and 606 on the processor substrate can be arranged to be a continuous linear pad. This provides for relaxed tolerances in the alignment of the processor substrate to the power conversion substrate, and reduces the net torsional force on the two substrates. Note that bypass capacitor 607 may be installed beneath the contact arrangement 61 in a manner similar to that as described in FIG. 3.

In summary, the forgoing discussion discloses a low impedance power interconnect between the power dissipating device and the power source. The impedance of the power interconnect is low in inductance and resistance throughout a wide frequency band in order to ensure that the voltage drops across the interconnect are mitigated across it during dynamic switching of power. It can also be seen that the interconnect should provide large 'z' axis compliance. The arrangement also reduces or eliminates the need for supporting electronic components on the device substrate because the interconnect impedance between the power conditioning circuit and the device can be reduced to the point where all or most of the support electronics can be located on the substrate having the power conditioning circuit itself.

The present invention also significantly reduces contentious routing of power to the power dissipating device because the power interconnect impedance is significantly lowered and can be routed to one or more sides of the power dissipating device.

Further, since the upper layers of the power dissipating device substrate are used primarily for power distribution, the area on additional layers beneath the upper layers are free for use with for signal and other conductive interconnects. These other conductive interconnects can connect other interconnects or substrates beneath or above the stackup.

CONCLUSION

The foregoing description of the preferred embodiment of the invention has been presented for the purposes of illustration and description. It is not intended to be exhaustive or to limit the invention to the precise form disclosed. Many modifications and variations are possible in light of the above teaching. For example, the substrate contacts and compressible conductors can be disposed proximate the outer periphery of the substrates rather than proximate the power dissipating device as described herein. Further, the compressible conductors may be rigid instead of compressible, while still permitting the detachable design described herein. Also, the compressible conductors can be integrated with other assemblies such as a socket which might be used to interconnect signals to the microprocessor. Further, more than one linear set of contacts can be arranged to circumscribe the power dissipating device in a manner to increase the total number of contacts providing power and/or ground to the device, thus reducing the overall connection inductance and increasing total current carrying capability. The z-axis compliant contacts can also be configured so as to permit acceptance of stackup height variations.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for providing power to a power dissipating device, comprising:
    a first circuit board having a power conditioner circuit, the first circuit board having a first side and a second side having a plurality of first circuit board contacts thereon, the first circuit board contacts including a first set of first circuit board contacts communicatively coupled to a first power conditioner circuit connector and a second set of first circuit board contacts communicatively coupled to a second power conditioning circuit connector;
    a second circuit board having:
        the power dissipating device mounted thereto;
        a plurality of second circuit board contacts disposed on a first side of the second circuit board facing the second side of the first circuit board, the second circuit board including a first set of second circuit board contacts communicatively coupled to a power dissipating device first connector and a second set of second circuit board contacts communicatively coupled to a second connector of the power dissipating device;
    a plurality of z-axis compressible conductors disposed between the first circuit board contacts and the second circuit board contacts; and
        wherein the plurality of z-axis compressible conductors includes a first set of z-axis compressible conductors disposed between the first set of first circuit board contacts and the first set of second circuit board contacts and a second set of z-axis compressible conductors disposed between the second set of first circuit board contacts and the second set of second circuit board contacts, and
        wherein the first set of first circuit board contacts, the first set of z-axis compressible conductors, and the first set of second circuit board contacts define a plurality of first paths from the first circuit board to the second circuit board and wherein the second set of first circuit board contacts, the second set of z-axis compressible conductors, and the second set of second circuit board contacts define a plurality of second paths from the first circuit board to the second circuit board.

2. The apparatus of claim 1, wherein the plurality of first paths are ground paths and the plurality of second paths are power paths.

3. The apparatus of claim 1, wherein the plurality of first paths are positive polarity paths and the plurality of second paths are negative polarity paths.

4. The apparatus of claim 1, wherein:
    the plurality of first paths are disposed circumferentially around the plurality of second paths.

5. The apparatus of claim 1, wherein the plurality of z-axis compressible conductors are disposed circumferentially about the power dissipating device.

6. The apparatus of claim 1, wherein the plurality of z-axis compressible conductors are disposed circumferentially about the second circuit board.

7. The apparatus of claim 1, wherein the plurality of z-axis compressible conductors are permanently attached to the plurality of first circuit board contacts or the plurality of second circuit board contacts.

8. The apparatus of claim 1, wherein the first circuit board is detachable from the second circuit board.

9. The apparatus of claim 1, wherein at least one of the plurality of first paths and the plurality of second paths is a signal path.

10. The apparatus of claim 1, wherein at least one of the plurality of first paths and the plurality of second paths is a power control path.

11. The apparatus of claim 1, wherein at least one of the z-axis compressible conductors comprises a cantilevered beam.

12. The apparatus of claim 1, further comprising:
    a capacitive element disposed on the first circuit board on the first side and adjacent to at least one of the first circuit board contacts.

13. The apparatus of claim 1, further comprising:
    a capacitive element disposed on a second side of the second circuit board and adjacent to at least one of the second circuit board contacts.

14. The apparatus of claim 1, wherein the first set of z-axis compressible conductors is oriented in a first direction, and the second set of z-axis compressible conductors is oriented in a second direction rotated 180 degrees from the first direction.

15. The apparatus of claim 1, wherein the first set of z-axis compressible conductors is oriented in a first direction and the second set of z-axis compressible conductors is oriented in a second direction opposite the first direction, thereby defining a scissor-shaped relationship between the first set of compressible conductors and the second set of compressible conductors.

16. The apparatus of claim 1, wherein:
    the plurality of z-axis compressible conductors comprise a first z-axis compressible conductor and a second z-axis compressible conductor adjacent the first z-axis compressible conductor;

the first z-axis compressible conductor is communicatively coupled to a first conductive layer of the second circuit board;

the first conductive layer is communicatively coupled to a second conductive layer of the second circuit board; and the second z-axis compressible conductor is communicatively coupled to the second conductive layer of the second circuit board.

17. The apparatus of claim 2, wherein:

the plurality of ground paths are interleaved with the plurality of power paths.

18. The apparatus of claim 3, wherein the plurality of positive polarity paths are interleaved with the plurality of negative polarity paths.

19. The apparatus of claim 11, wherein the at least one of the z-axis compressible conductors is U-shaped.

20. The apparatus of claims 12 or 13, wherein the capacitive element has a capacitance selected according to an inductance of the plurality of power paths between the first circuit board and the second circuit board.

21. The apparatus of claims 12 or 13, wherein the capacitive element is displaced from the at least one contact along a z-axis.

22. The apparatus of claim 14, wherein the first set of z-axis compressible conductors is displaced in a direction opposite the second set of z-axis compressible conductors when the first and second set of compressible conductors are compressed in the z-axis.

23. The apparatus of claim 16, wherein:

the first z-axis compressible conductor is communicatively coupled to a first conductive layer of the second circuit board by one of the second circuit board contacts, a first pad and a first via;

the first conductive layer is communicatively coupled to the second conductive layer of the second circuit board by a capacitor; and the second z-axis compressible conductor is communicatively coupled to the second conductive layer of the second circuit board by a second one of the second circuit board contacts, a second pad and a second via.

24. The apparatus of claim 19, wherein the U-shaped z-axis compressible conductor comprises an S-shaped section, the S-shaped section presenting a surface parallel to the first circuit board.

25. The apparatus of claim 19, wherein at least one of the z-axis compressible conductors comprises:

a first shaft portion having a first end and a second end distal from the first end;

a first U-shaped bend portion having a first end adjacent the second end of the first shaft portion and a second end;

a second shaft portion having a first end adjacent the second end of the first U-shaped bend portion and a second end distal from the first end;

a second U-shaped bend portion having a first end adjacent the second end of the second shaft portion and a second end; and a third shaft portion, disposed between the first shaft portion and the second shaft portion, the third shaft portion having a first end adjacent the second end of the second U-shaped bend portion and a second end distal from the third end.

26. The apparatus of claim 19, further comprising a bend portion having a first end disposed adjacent the second end of the third shaft portion and a second end distal from the first end and directed toward the second shaft portion.

27. The apparatus of claim 23, wherein the capacitor is surface mounted to a second side of the second circuit board and proximate the one of the second circuit board contacts.

* * * * *